(12) United States Patent
Wang et al.

(10) Patent No.: US 12,133,474 B2
(45) Date of Patent: *Oct. 29, 2024

(54) MAGNETORESISTIVE RANDOM ACCESS MEMORY AND METHOD OF MANUFACTURING THE SAME

(71) Applicant: UNITED MICROELECTRONICS CORP., Hsin-Chu (TW)

(72) Inventors: Hui-Lin Wang, Taipei (TW); Chen-Yi Weng, New Taipei (TW); Chin-Yang Hsieh, Tainan (TW); Yi-Hui Lee, Taipei (TW); Ying-Cheng Liu, Tainan (TW); Yi-An Shih, Changhua County (TW); Jing-Yin Jhang, Tainan (TW); I-Ming Tseng, Kaohsiung (TW); Yu-Ping Wang, Hsinchu (TW); Chien-Ting Lin, Tainan (TW); Kun-Chen Ho, Tainan (TW); Yi-Syun Chou, Taipei (TW); Chang-Min Li, Yunlin County (TW); Yi-Wei Tseng, New Taipei (TW); Yu-Tsung Lai, Tainan (TW); Jun Xie, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/373,295

(22) Filed: Sep. 27, 2023

(65) Prior Publication Data

US 2024/0032439 A1 Jan. 25, 2024

Related U.S. Application Data

(60) Division of application No. 17/835,986, filed on Jun. 9, 2022, now Pat. No. 11,812,669, which is a
(Continued)

(30) Foreign Application Priority Data

Jul. 15, 2019 (CN) .......................... 201910634906.1

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
None
See application file for complete search history.

(56) References Cited

U.S. PATENT DOCUMENTS 7,598,555 B1 10/2009 Papworth Parkin
8,878,318 B2 11/2014 Chen
(Continued)

FOREIGN PATENT DOCUMENTS

JP 11-168073 A 6/1999
JP 2012-104735 A 5/2012

*Primary Examiner* — Hung K Vu
(74) *Attorney, Agent, or Firm* — Winston Hsu

(57) ABSTRACT

A method of fabricating magnetoresistive random access memory, including providing a substrate, forming a bottom electrode layer, a magnetic tunnel junction stack, a top electrode layer and a hard mask layer sequentially on the substrate, wherein a material of the top electrode layer is titanium nitride, a material of the hard mask layer is tantalum or tantalum nitride, and a percentage of nitrogen in the titanium nitride gradually decreases from a top surface of top electrode layer to a bottom surface of top electrode layer, and patterning the bottom electrode layer, the magnetic tunnel junction stack, the top electrode layer and the hard mask layer into multiple magnetoresistive random access memory cells.

5 Claims, 6 Drawing Sheets

Related U.S. Application Data continuation of application No. 17/131,767, filed on Dec. 23, 2020, now Pat. No. 11,387,408, which is a division of application No. 16/531,129, filed on Aug. 5, 2019, now Pat. No. 10,910,553.

(56) References Cited

U.S. PATENT DOCUMENTS

| | | |
|---|---|---|
| 9,178,135 B2 | 11/2015 | Kim |
| 9,508,925 B2 | 11/2016 | Pi |
| 9,818,935 B2 | 11/2017 | Chuang |
| 9,865,649 B2 | 1/2018 | Tan |
| 11,387,408 B2 * | 7/2022 | Wang .................... H10N 50/85 |
| 2007/0183187 A1 | 8/2007 | Guo |
| 2007/0246832 A1 | 10/2007 | Odagawa |
| 2010/0301436 A1 | 12/2010 | Sashida |
| 2011/0089507 A1 * | 4/2011 | Mao ....................... H10B 61/00 |
| | | 257/E29.323 |
| 2011/0284815 A1 * | 11/2011 | Kim .................... H10N 70/801 |
| | | 257/E47.001 |
| 2012/0074511 A1 | 3/2012 | Takahashi |
| 2013/0001717 A1 | 1/2013 | Zhou |
| 2014/0131824 A1 | 5/2014 | Kitagawa |
| 2016/0079519 A1 | 3/2016 | Yoshikawa |
| 2016/0268336 A1 | 9/2016 | Shum |
| 2019/0140019 A1 * | 5/2019 | Nagel ................... H10N 50/01 |

* cited by examiner

MAGNETORESISTIVE RANDOM ACCESS MEMORY AND METHOD OF MANUFACTURING THE SAME

CROSS REFERENCE TO RELATED APPLICATIONS

This application is a division of U.S. application Ser. No. 17/835,986, filed on Jun. 9, 2022, which is a continuation application of U.S. application Ser. No. 17/131,767, filed on Dec. 23, 2020, which is a division of U.S. application Ser. No. 16/531,129, filed on Aug. 5, 2019. The contents of these applications are incorporated herein by reference.

BACKGROUND OF THE INVENTION

1. Field of the Invention

The present invention generally relates to a magnetoresistive random access memory, and more specifically, to a magnetoresistive random access memory with particular composition of top electrode.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate magnetoresistive random access memory (MRAM) devices, which typically has the advantage of keeping stored data even when the device is not connected to an electrical source.

The aforementioned MR effect has also been used in magnetic field sensor areas including, for example, electronic compass components used in global positioning system (GPS) of cellular phones for providing information regarding moving location to users. Currently, various magnetic field sensor technologies such as anisotropic magnetoresistance (AMR) sensors, giant magnetoresistance (GMR) sensors, magnetic tunnel junction (MTJ) sensors have been widely developed in the market. Nevertheless, nowadays MRAM still suffer many problems resulted from processes, such as the problem of tail bit performance. How to come up with an improved device to resolve these issues has become an important task in this field.

SUMMARY OF THE INVENTION

In order to improve the performance of tail bits in magnetoresistive random access memory (MRAM), the present invention hereby provides a MRAM structure with particular composition of top electrode to prevent etchant penetrating through the top electrode and damaging the magnetic tunnel junction (MTJ) thereunder.

One aspect of the present invention is to provide a magnetoresistive random access memory cell, which includes a substrate, a bottom electrode layer on the substrate, a magnetic tunnel junction stack on the bottom electrode layer, and a top electrode layer on the magnetic tunnel junction stack, wherein a material of the top electrode layer is titanium nitride, and a percentage of nitrogen in the titanium nitride gradually decreases from a top surface of top electrode layer to a bottom surface of top electrode layer, and a hard mask layer disposed on the top electrode layer, wherein a material of the hard mask layer is tantalum or tantalum nitride.

Another aspect of the present invention is to provide a method of fabricating magnetoresistive random access memory, including steps of providing a substrate, forming a bottom electrode layer, a magnetic tunnel junction stack, a top electrode layer and a hard mask layer sequentially on the substrate, wherein a material of the top electrode layer is titanium nitride, a material of the hard mask layer is tantalum or tantalum nitride, and a percentage of nitrogen in the titanium nitride gradually decreases from a top surface of top electrode layer to a bottom surface of top electrode layer, and patterning the bottom electrode layer, the magnetic tunnel junction stack, the top electrode layer and the hard mask layer into multiple magnetoresistive random access memory cells.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
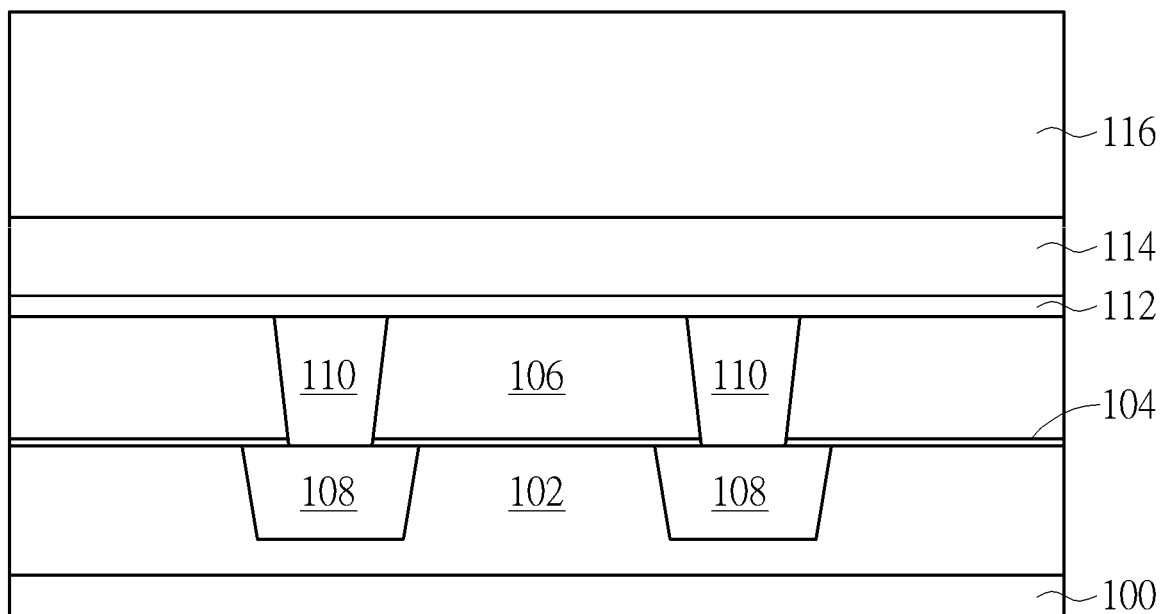
FIG. 1 to FIG. 5 are schematic cross-sections illustrating the method of fabricating a magnetoresistive random access memory in accordance with the embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1 to FIG. 5, which are schematic cross-sections illustrating a method of fabricating a magnetoresistive random access memory (MRAM) in accordance with the embodiment of present invention. As shown in FIG. 1, a substrate 100 made of semiconductor material is first provided, in which the semiconductor material may be selected from the group consisting of silicon (Si), germanium (Ge), silicon germanium (SiGe) compounds, silicon carbide (SiC), and gallium arsenide (GaAs), etc. The substrate 100 is preferably defined with magnetic memory regions and logic regions thereon. However, only the structure relevant to MRAM cell on the magnetic memory regions will be shown in the figure in case obscuring the focus of the present invention.

An inter-metal dielectric (IMD) layer 102, a stop layer 104 and an inter-layer dielectric (ILD) layer 106 are formed sequentially on the substrate 100. The material of inter-metal dielectric layer 102 is preferably ultra low-k material, such as porous silicon oxide carbides (SiOC). The material of stop layer 104 is preferably nitrogen doped carbide, silicon nitride or silicon carbonitride (SiCN), etc, and the material of inter-layer dielectric layer 106 is preferably tetraethoxysilane (TEOS), but not limited thereto, wherein metal layers 108 and contact plugs 110 may be formed respectively in the inter-metal dielectric layer 102 and the inter-layer dielectric layer 106 by using single damascene process or dual damascene process. The metal layer 108 and the contact plug 110 may be embedded in the inter-metal dielectric layer 102, the stop layer 104 and the inter-layer dielectric layer 106 and electrically connect with each other. The material of metal layer 108 and contact plug 110 may be selected from the combination of tungsten (W), copper (Cu), aluminum (Al), titanium aluminum (TiAl) alloy and cobalt-tungsten-phosphorous (CoWP) alloy, etc, but not limited thereto.

Please refer again to FIG. 1. A bottom electrode layer 112, a magnetic tunnel junction (MTJ) stack 114 and a top electrode layer 116 are further formed sequentially on the inter-layer dielectric layer 106. The bottom electrode layer 112, the magnetic tunnel junction stack 114 and the top electrode layer 116 may be in-situ formed in the same chamber by using physical vapor deposition (PVD). In the embodiment of present invention, the material of bottom electrode layer 112 preferably includes conductive materials, such as tantalum nitride (TaN), but not limited thereto. According to other embodiment of the present invention, the bottom electrode layer 112 may include tantalum (Ta), platinum (Pt), copper (Cu), gold (Au), aluminum (Al) or the combination thereof. The magnetic tunnel junction stack 114 is a multilayer structure, which may include structures like seed layer, pinned layer, reference layer, tunneling barrier layer, free layer and metal spacer, etc. Generally, the pinned layer could be made of antiferromagnetic (AFM) material including but not limited to for example ferromanganese (FeMn), platinum manganese (PtMn), iridium manganese (IrMn), nickel oxide (NiO), or combination thereof, to fix or restrict the direction of magnetic moment of adjacent layers. The tunneling barrier layer could include oxide containing insulating material such as aluminum oxide (AlOx) or magnesium oxide (MgO), but not limited thereto. The free layer could be made of ferromagnetic material including but not limited to iron (Fe), cobalt (Co), nickel (Ni), or the alloys thereof such as cobalt-iron-boron (CoFeB), in which the magnetized direction of the free layer could be altered freely depending on the influence of outside magnetic field. Since detailed structure of the magnetic tunnel junction stack 114 is not the key point of the present invention, all of the aforementioned multilayer structure will be represented by a magnetic tunnel junction stack 114 in the figures.

In the embodiment, the material of top electrode layer 116 is titanium nitride, which preferably has a composition gradient. That is, the composition of titanium nitride in entire top electrode layer 116 is not uniform. More specifically, the percentage of nitrogen in the titanium nitride of top electrode layer 116 would preferably and gradually decreases from the top surface (exposed surface) of top electrode layer 116 to the bottom surface (the surface adjoining the magnetic tunnel junction stack 114) of top electrode layer 116, while the percentage of titanium in the titanium nitride of top electrode layer 116 would preferably and gradually increase from the top surface of top electrode layer 116 to the bottom surface of top electrode layer 116. In other words, the portion adjacent to the bottom surface of top electrode layer 116 or adjacent to the interface between the top electrode layer 116 and the magnetic tunnel junction stack 114 is preferably provided with higher concentration distribution of titanium or lower concentration distribution of nitrogen, while the portion adjacent to the top surface of top electrode layer 116 is preferably provided with higher concentration distribution of nitrogen and lower concentration distribution of titanium, wherein the percentage of nitrogen in the titanium nitride of top electrode layer 116 is greater than 0% and less than 50%. Detailed function of composition gradient in the titanium nitride of top electrode layer 116 will be explained in later embodiment.

Figure 2:
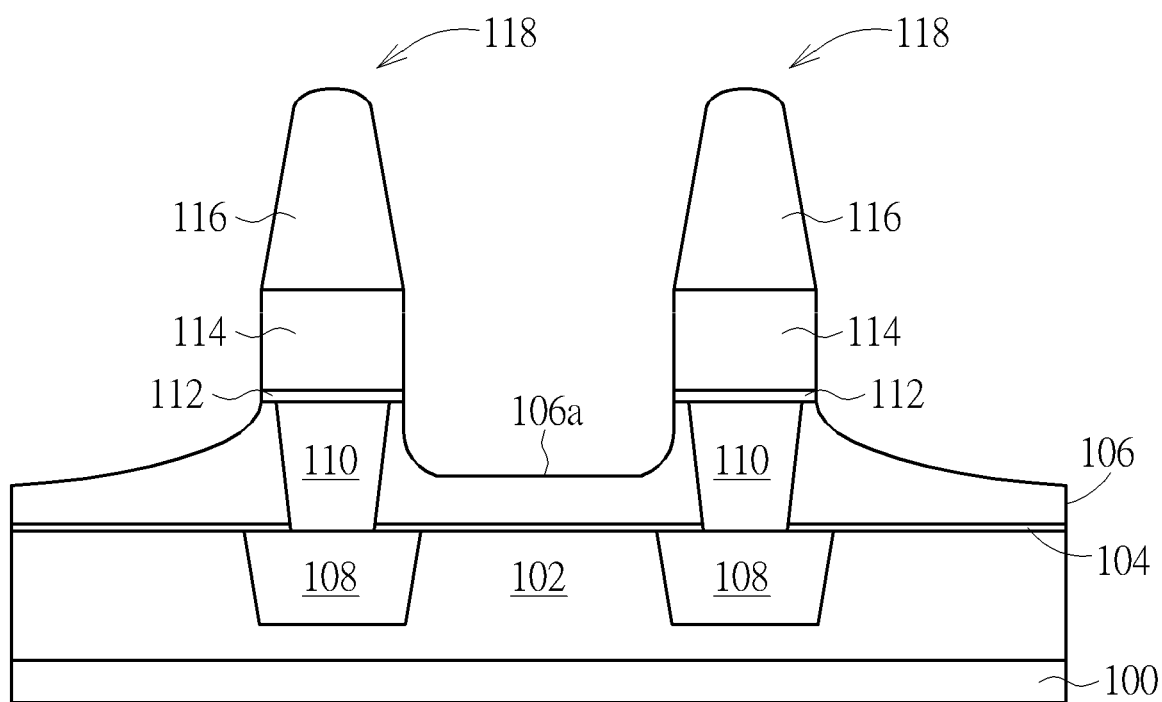

Thereafter, as shown in FIG. 2, using photolithographic and etch process to pattern top electrode layer 116, magnetic tunnel junction stack 114 and bottom electrode layer 112, thereby defining individual MRAM cells 118. In this step, a reactive ion etching (RIE) process may be first used with a silicon oxide layer as hard mask to pattern the top electrode layer 116, so as to have less sidewall byproduct. An ion beam etching (IBE) process is then used to pattern the magnetic tunnel junction stack 114, the bottom electrode layer 112 and the inter-layer dielectric layer 106 to define the MRAM cells 118. Since the characteristics of ion beam etching process, the top surface 106a of remaining inter-layer dielectric layer 106 after etching would be preferably lower than the top surface of contact plug 110 and is preferably a cambered or curved surface.

Figure 3:
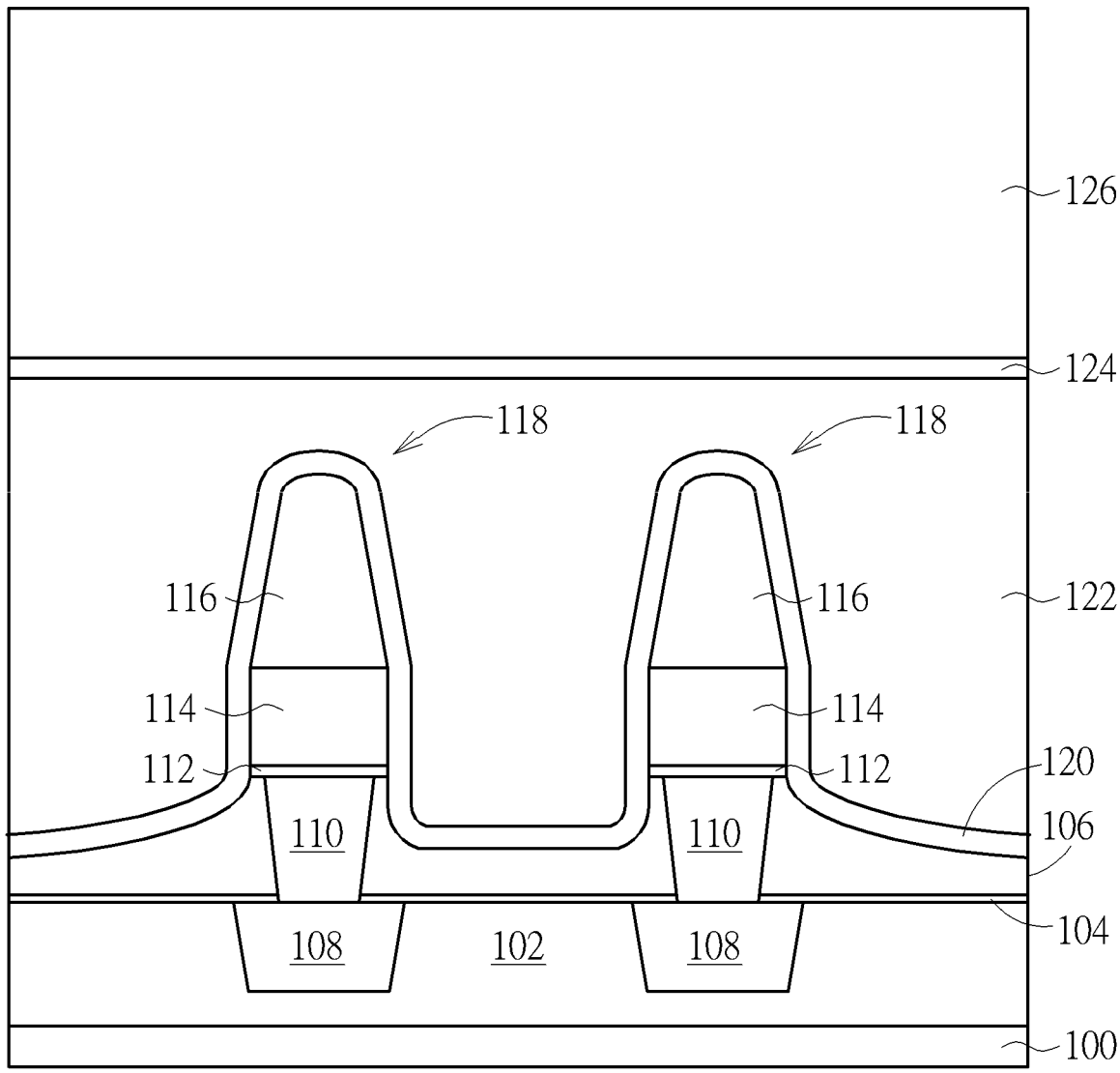

Thereafter, as shown in FIG. 3, forming a conformal liner layer 120 on the surface of MRAM cells 118 and inter-layer dielectric layer 106, wherein the material of liner layer 120 preferably includes silicon nitride. However, other dielectric materials may also be selected, such as silicon oxide, silicon oxynitride or silicon oxide carbides, depending on process requirements. Next, a dielectric layer 122, a stop layer 124 and an inter-metal dielectric 126 are sequentially formed on the liner layer 120. The dielectric layer 122 would fill up the gap between the MRAM cells 118 and be planarized by using planarization process such as chemical mechanical polishing (CMP), so that it's top surface would be level with or slightly higher than the MRAM cells 118. In the embodiment of present invention, the material of dielectric layer 122 and inter-metal dielectric 126 is preferably ultra low-k material, and the material of stop layer 124 is preferably nitrogen doped carbide, silicon nitride or silicon carbonitride (SiCN).

Figure 4:
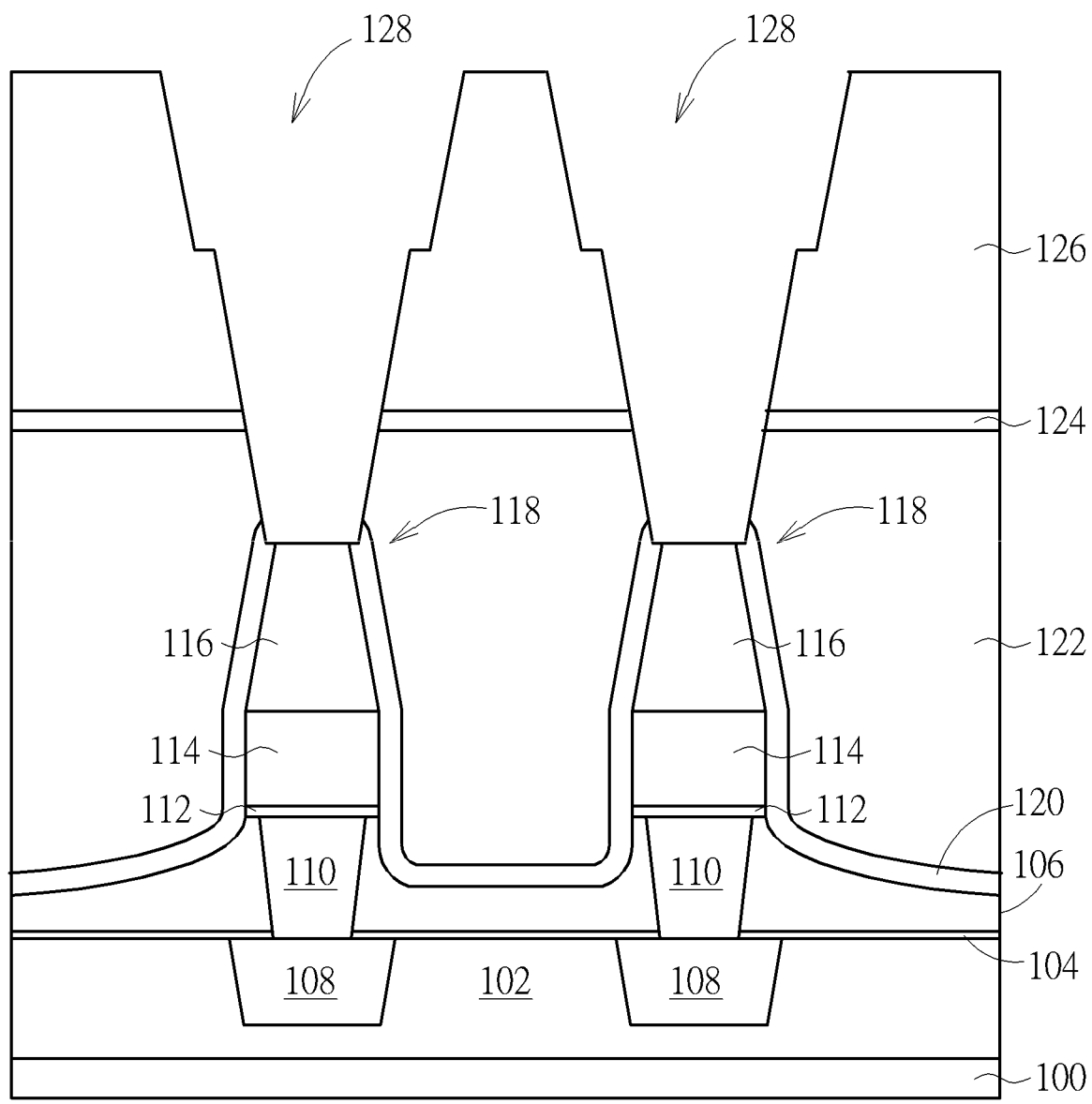

Thereafter, as shown in FIG. 4, a dual damascene recess 128 is formed in the inter-metal dielectric 126, which includes portions for contact hole and metal layer. The dual damascene recess 128 extends through the liner layer 120 on the MRAM cells 118 to expose the top electrode layer 116 thereof. In the embodiment of disclosure, the dual damascene recess 128 may be formed by forming patterned photoresist and patterned hard mask on the inter-metal dielectric 126 and performing several etch processes and wet clean processes. Since how to form the dual damascene recess 128 is not the key point of the present invention, relevant detailed steps will not be disclosed in the specification and in the figures.

In the embodiment of present invention, the dual damascene recesses 128 on the MRAM region and the dual damascene recesses on logic region (not shown) are intended to be formed in the same processes. Regarding the devices on the logic region, a wet etch process would be additionally performed after the dual damascene recesses are formed in order to remove polymer byproduct and TiN-based hard mask layer exposed from the recesses. The etchant used in this wet etch process, such as DuPont's EKC residue remover series combined with hydrogen peroxide solution, has quite high etching power to titanium nitride and oxide thereof. Moreover, the titanium nitride layer is generally grown in the form of column-like polycrystalline structure. This type of titanium nitride layer has high surface toughness, with multiple inherent pinhole defects extending directly downward to the bottom of titanium nitride layer between the crystalline columns. For this reason, the aforementioned wet etch process used to remove the hard mask on logic region would simultaneously remove a part of TiN-based top electrode layer 116 on the MRAM region. The etchant may even further penetrate to the bottom of top electrode layer 116 and damage underlying magnetic tunnel junction stack 114, so that the ferromagnetic layer in the magnetic tunnel junction stack 114 would lose its ferromagnetism. This phenomenon especially causes the issue of tail bits failure.

In the present invention, the advantage of having a TiN composition gradient in the top electrode layer 116 is that the magnetic tunnel junction stack 114 may be prevented from the damage by the wet etch process. The principle of this prevention lies in that the less the nitrogen composition in the titanium nitride, its crystal form is closer to compact metal form rather than polycrystalline form. That is, the grain size and surface toughness of the titanium nitride will be smaller and the pinhole defects will be fewer. Through the design of less nitrogen percentage in the TiN composition of top electrode layer 116 in portion closer to the magnetic tunnel junction stack 114, the etchant is not easy to penetrate through the magnetic tunnel junction stack 114, so that the underlying magnetic tunnel junction stack 114 may be prevented from the damage by the etchant.

Figure 5:
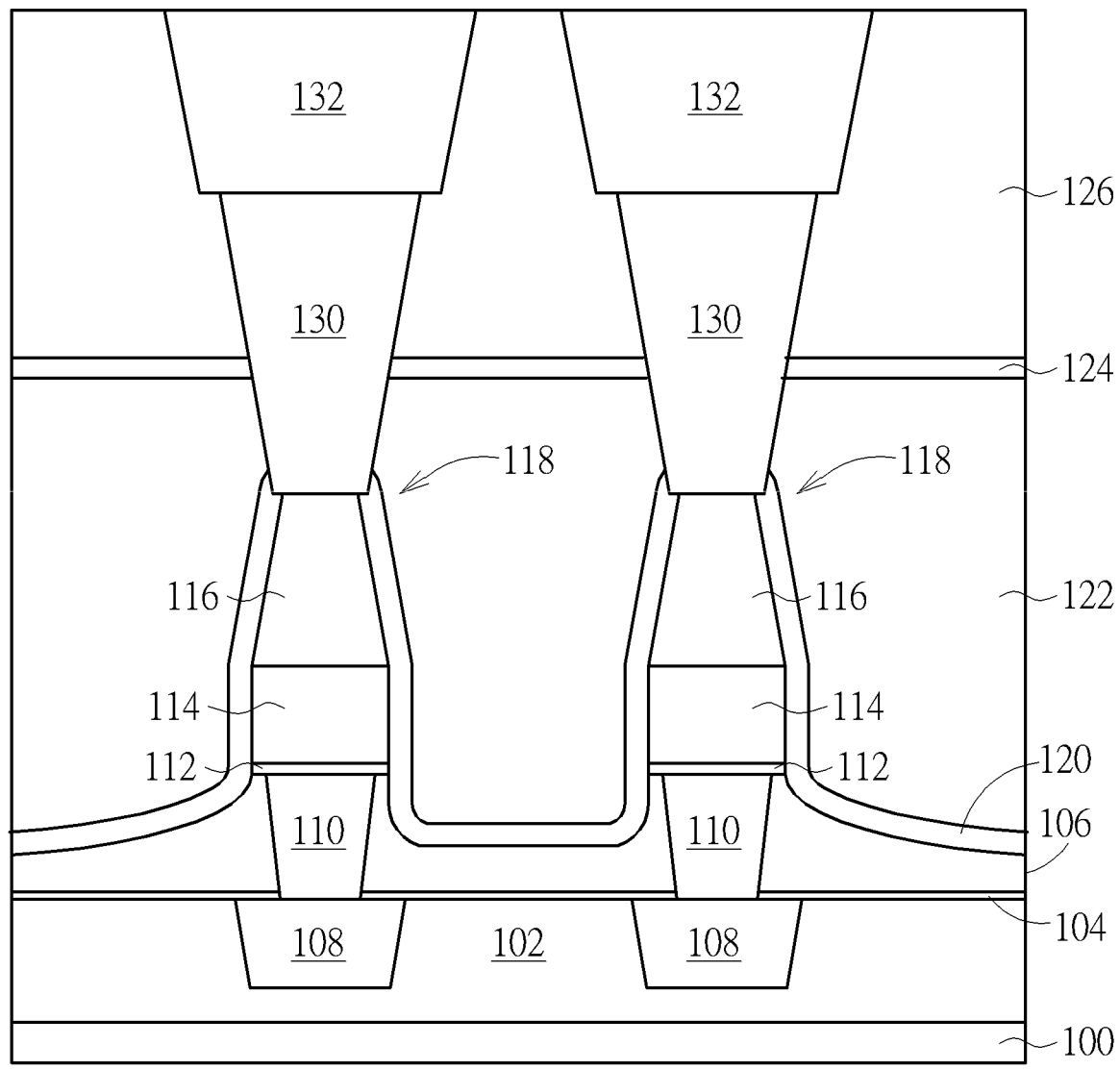

Thereafter, as shown in FIG. 5, the dual damascene recess 128 is filled with required metal material, for example, including titanium (Ti), titanium nitride (TiN), tantalum (Ta) and/or tantalum nitride (TaN) as barrier layers and selected from low resistance material like tungsten (W), copper (Cu), aluminum (Al), titanium aluminum (TiAl) alloy, cobalt-tungsten-phosphorous (CoWP) alloy or the combination thereof as low resistance metal layers. A planarization process such as a CMP process is then performed to remove a part of the metal material and to form the dual damascene structure consisting of contact plug 130 and metal layer 132, in order to electrically connect with underlying top electrode layer 116 of the MRAM cell 118.

According to the process method in aforementioned embodiment, the present invention hereby provides a novel magnetoresistive random access memory cell 118. As shown in FIG. 5, the structure of MRAM cell 118 includes a bottom electrode layer 112 on a substrate 100, a magnetic tunnel junction stack 114 on the bottom electrode layer 112, and a top electrode layer 116 on the magnetic tunnel junction stack 114, wherein the material of top electrode layer 116 is titanium nitride, and the percentage of nitrogen in the titanium nitride gradually decreases from the top surface of top electrode layer 116 to the bottom surface of top electrode layer 116, and the percentage of nitrogen in the titanium nitride is greater than 0% and less than 50%.

Figure 6:
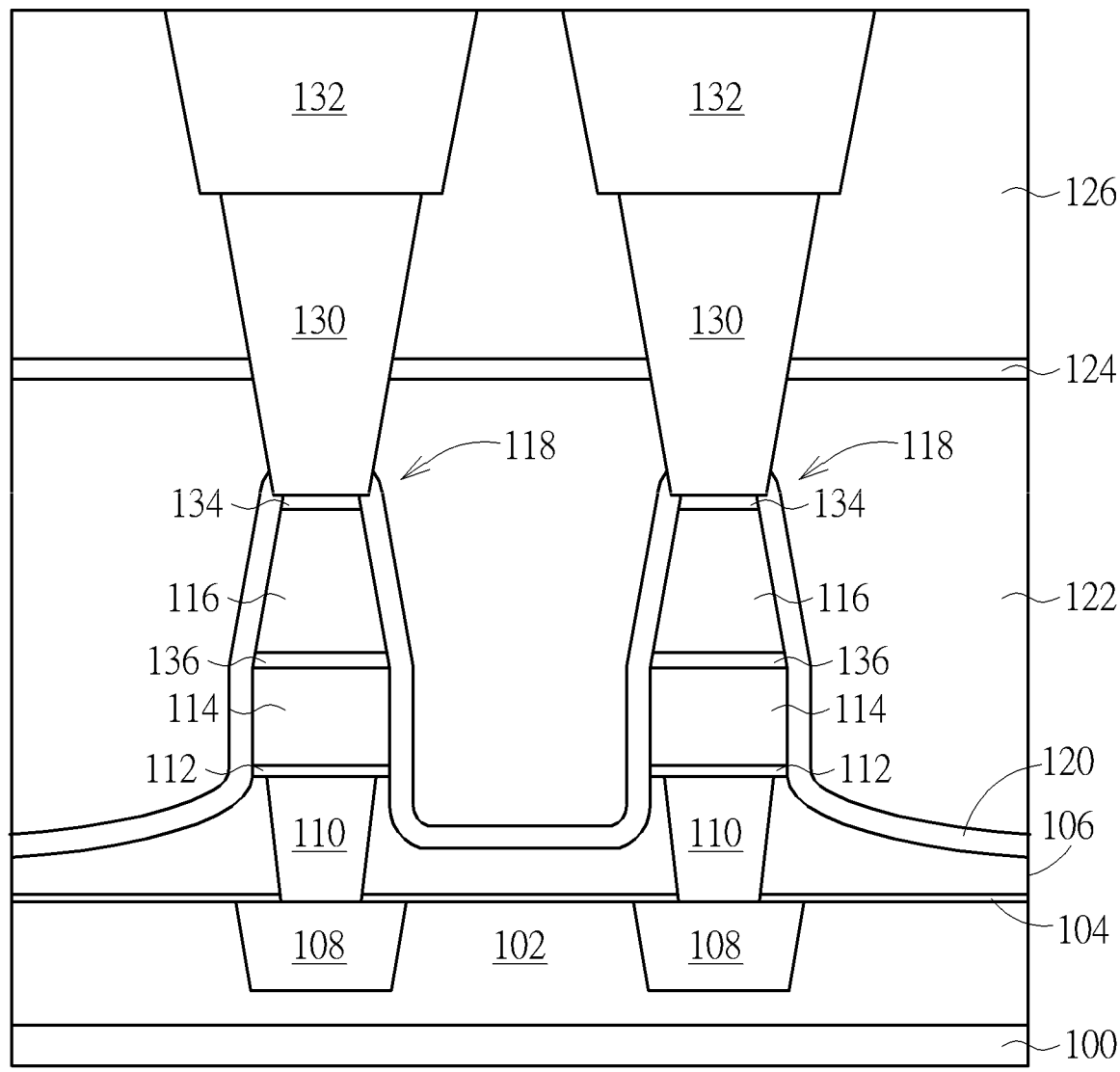
FIG. 6 is a schematic cross-section of a magnetoresistive random access cell in accordance with another embodiment of present invention.

In addition to the aforementioned characteristics of TiN composition gradient, in other embodiment, other features may be added to the MRAM to improve the protection effect for magnetic tunnel junction stack. Please refer to FIG. 6, which is a schematic cross-section of a magnetoresistive random access cell in accordance with another embodiment of present invention. As shown in FIG. 6, a hard mask layer 134 may be disposed between the top electrode layer 116 and the contact plug 130 of the MRAM cell 118. The material of hard mask layer 134 is preferably tantalum (Ta) or tantalum nitride (TaN), which may prevent the etchant at top surface of top electrode layer 116 penetrating to the magnetic tunnel junction stack 114 through the top electrode layer 116. Alternatively, an etch stop layer 136 may be disposed between the top electrode layer 116 and the magnetic tunnel junction stack 114. The material of etch stop layer 136 is preferably an multilayer stack of alternating ruthenium (Ru) or ruthenium oxide (RuO), which has excellent anti-corrosion characteristics to further prevent the etchant damaging the magnetic tunnel junction stack 114. The design of alternating layer stack of ruthenium and ruthenium oxide may also prevent peeling issue of magnetic tunnel junction stack 114 due to the corrosion by etchant. The aforementioned hard mask layer 134 and etch stop layer 136 may also be in-situ formed with the layer structures like bottom electrode layer 112, magnetic tunnel junction stack 114 and top electrode layer 116 in the same chamber by using physical vapor deposition (PVD).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating magnetoresistive random access memory, comprising:
   providing a substrate;
   forming a bottom electrode layer, a magnetic tunnel junction stack, a top electrode layer and a hard mask layer sequentially on said substrate, wherein a material of said top electrode layer is titanium nitride, a material of said hard mask layer is tantalum or tantalum nitride, and a percentage of nitrogen in said titanium nitride gradually decreases from a top surface of top electrode layer to a bottom surface of top electrode layer; and patterning said bottom electrode layer, said magnetic tunnel junction stack, said top electrode layer and said hard mask layer into multiple magnetoresistive random access memory cells.

2. The method of fabricating magnetoresistive random access memory of claim 1, wherein said percentage of nitrogen in said titanium nitride is greater than 0% and less than 50%.

3. The method of fabricating magnetoresistive random access memory of claim 1, further comprising an etch stop layer disposed between said top electrode layer and said magnetic tunnel junction, wherein a material of said etch stop layer comprises ruthenium or ruthenium oxide.

4. The method of fabricating magnetoresistive random access memory of claim 3, wherein said etch stop layer is a layer stack of alternating ruthenium layers and ruthenium oxide layers.

5. The method of fabricating magnetoresistive random access memory of claim 1, wherein said magnetic tunnel junction layer comprises seed layer, pinned layer, reference layer, tunneling barrier layer, free layer, and metal spacer.

* * * * *